(12) United States Patent
Ryan et al.

(10) Patent No.: US 6,426,544 B1
(45) Date of Patent: *Jul. 30, 2002

(54) FLEXIBLE INTERCONNECTIONS WITH DUAL-METAL DUAL-STUD STRUCTURE

(75) Inventors: James G. Ryan, Fairfield County, CT (US); Badih El-Kareh, Dutchess County, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/351,440

(22) Filed: Jul. 12, 1999

Related U.S. Application Data

(62) Division of application No. 08/651,772, filed on May 22, 1996.

(51) Int. Cl.⁷ .............................................. H01L 29/00
(52) U.S. Cl. ....................... 257/532; 257/528; 257/758; 257/306; 438/957
(58) Field of Search ................................ 257/532, 306, 257/308, 750, 758, 767, 759; 438/240, 957, 634, 637, 638

(56) References Cited

U.S. PATENT DOCUMENTS

| 4,481,283 A | 11/1984 | Kerr et al. ................... 430/319 |
| 4,553,050 A | 11/1985 | Feinberg et al. .............. 307/43 |
| 4,767,724 A | 8/1988 | Kim et al. |
| 4,920,072 A | 4/1990 | Keller et al. |
| 4,962,058 A | 10/1990 | Cronin et al. |
| 5,275,963 A | 1/1994 | Cederbaum et al. |
| 5,381,046 A | 1/1995 | Cederbaum et al. |
| 5,406,447 A | 4/1995 | Miyazaki .................... 301/313 |
| 5,442,236 A * | 8/1995 | Fukazawa ................... 257/758 |
| 5,444,022 A | 8/1995 | Gardner |
| 5,451,804 A | 9/1995 | Lur et al. .................... 257/330 |
| 5,459,345 A | 10/1995 | Okudaira et al. |
| 5,470,791 A | 11/1995 | Suguro et al. |
| 5,471,091 A | 11/1995 | Pasch et al. |
| 5,578,523 A | 11/1996 | Fiordalice et al. |
| 5,593,919 A | 1/1997 | Lee et al. |
| 5,604,156 A | 2/1997 | Chung et al. |
| 5,741,626 A | 4/1998 | Jain et al. |
| 5,760,429 A * | 6/1998 | Yano et al. .................. 257/211 |
| 5,874,770 A * | 2/1999 | Saia et al. ................... 257/536 |
| 5,879,981 A * | 3/1999 | Tanigawa .................... 438/241 |

FOREIGN PATENT DOCUMENTS

| EP | 0 574 275 A1 | 6/1993 | .................... 29/92 |
| JP | 60257553 | 12/1985 | |
| JP | 03142973 | 6/1991 | |
| JP | 08181282 | 7/1996 | |

OTHER PUBLICATIONS

IBM Technical Disclosure Bulletin; "High Capacitance Tungsten to Metal Capacitor for High Frequency Applications"; B.D. Johnson et al.; vol. 38, No. 2, Feb. 1995; pp. 611–613.

IBM Technical Disclosure Bulletin; "Single–Step, Multi–level, Metalization Technique for Conformal Wiring", J.E. Cronin et al.; vol. 31, No. 4, Sep. 1988; pp. 400–401.

* cited by examiner

*Primary Examiner*—Tom Thomas
*Assistant Examiner*—Donghee Kang
(74) *Attorney, Agent, or Firm*—Whitham, Curtis & Christofferson, P.C.; Jay H. Anderson

(57) ABSTRACT

A metal interconnect having a high conductivity and high resistance to metal migration failure is formed of two layers of metal or alloy (such as TI/CuAlSi) with a dielectric interposed therebetween and a connection made between the layers by a conductive material, preferably in the form of a plug or stud formed in an aperture of an inter-level dielectric, at ends of the interconnect. A high precision metal-to-metal capacitor can be formed from the same layers by forming separate connections to each of the layers. The topography of the interconnect (and capacitor) is of reduced severity and facilitates planarization of an overlying inter-level dielectric.

11 Claims, 2 Drawing Sheets

FLEXIBLE INTERCONNECTIONS WITH DUAL-METAL DUAL-STUD STRUCTURE

CROSS-REFERENCE TO RELATED APPLICATION

This application is a divisional of U.S. patent application Ser. No. 08/651,772, filed May 22, 1996, and claims priority under 35 USC §120 therefrom.

BACKGROUND OF THE INVENTION

1. Field of the Invention

The present invention generally relates to Integrated circuit structures and fabrication and, more particularly, to formation of wiring having improved resistance to electromigration and stress migration failure and high precision capacitors.

2. Description of the Prior Art

Increasing density of integrated circuits has been encouraged by both the economies to be derived from manufacture of more integrated circuits on each wafer and the performance benefits of decreased noise susceptibility and increased signal propagation speed. However, high integration density implies small feature size (e.g. interconnect line width) and decreased wiring pitch in-order to interconnect increased numbers of electronic elements formed on each chip.

While methods of depositing interconnection materials on wafers have become highly developed and can be performed with high manufacturing yield, connections, referred to as interconnects, formed at small sizes may fail after being put into service due to processes which occur within grains and grain boundaries of interconnect materials. Specifically, metal migration phenomena, known as electromigration and stress migration are principal causes of such failures. (The term "metal migration" is used hereinafter as generic to both stress migration failure and electromigration.)

Electromigration is an incident of drift, motion, transport, migration, or displacement of metal atoms caused by passage of an electric current through an interconnect. Electromigration phenomena are affected by interconnect structure such as composition, grain size, layering and film orientation texture. For this reason, for example, large grain metal deposition is favored for resistance of a single metal to electromigration. Metal migration causes an accumulation of metal atoms and a complementary formation of voids in the crystal lattice which may eventually lead to opening of the interconnect. The transport and piling-up of metal atoms may also cause the formation of so-called hillocks or extrusions which are localized increases in cross-sectional dimensions of the conductor. Such an increase in dimensions may cause an electrical short circuit to a nearby-conductor or breakage of adjacent structures such as cracking of insulators which constitute another but related failure mode of a chip.

Electromigration is enhanced at any point at which current density increases in a conductor such as at a notch, a void or a thinning of an interconnect. Electromigration thus tends to increase any irregularity in the formation of an interconnect and to accelerate over time. The principal mechanism of preventing electromigration has been to decrease current density in the electronic design of the integrated circuit which, of course, imposes a trade-off between circuit reliability and both performance (if current density is reduced by reduction of signal levels) and integration density (if current density is reduced by increased interconnect dimensions).

Stress migration failure is also an incident of diffusion of metal atoms and is principally due to thermally induced stress. Specifically, while increase of temperature may tend to reduce stress in a semiconductor device, subsequent cooling increases stress while the device remains at a relatively high temperature allowing some relief of stress through material movement. A net migration of metal atoms can eventually cause opening of a conductor in the same manner as electromigration. Further, even when integrated circuits are carefully designed with cautious observance of current density levels in design and close tolerances in manufacture, the effects of stress-induced void formation can exacerbate electromigration effects.

Different materials exhibit different levels of tendency toward electromigration and stress migration failure. Aluminum, although very desirable in regard to most of its other properties, particularly as to cost, exhibits both electromigration and stress migration failure under common use and processing conditions. Therefore, substantial efforts have been made to increase the reliability of conductors by choice and combination of materials, particularly in regard to interconnect structures including aluminum. Layered interconnects have been of particular interest for such a purpose and are often referred to as redundant wiring structures since non-aluminum conductors can reduce the current density in the aluminum but remain available should the aluminum layer open. Other layers can, however be broken by hillock or extrusion formation on the aluminum layer.

For example, a so-called hafnium sandwich structure is known and has shown particular promise by reducing electromigration and median time to failure, thereby increasing circuit reliability. In this structure, a thin layer of hafnium is deposited on an aluminum layer and a further aluminum layer deposited thereover. Then, the aluminum and hafnium are reacted to form hafnium tri-aluminide ($HfAl_3$) at the interfaces. This structure provides a stable, dense barrier which prevents diffusion of aluminum between aluminum layers and the coincidence of voids or opens which might eventually develop. This structure does not prevent electromigration within each aluminum layer but an open or near-open which eventually develops in one aluminum layer would be able to heal before an open in the other aluminum alloy layer would be caused by an increase in current density at the same location in the other aluminum alloy layer.

However, the "hafnium sandwich" structure has additional unique problems and failure modes. Specifically, the formation of hafnium tri-aluminide is accompanied by a reduction of volume, causing void formation in the aluminum alloy. If the hafnium-aluminide is not completely formed prior to passivation, additional volume reduction may occur due to continuance of the reaction, further increasing stresses in surrounding structures and leading to defect formation. Formation of extrusions also occurs in the hafnium sandwich structure.

Other structures involving layers of metal and redundant conductors are also known and in use; some of which provide relative advantages as compared to others. Nevertheless, all known structures intended to reduce electromigration and/or stress migration failure have some failure modes.

As alluded to above, another failure mode of interconnections formed on integrated circuit chips is caused by severe topography over which a conductor is deposited. Further, severe topography can compromise the accuracy with which lithographic patterning can be carried out and may cause irregularity of conductor width and/or separation. Topography of sufficient severity to compromise conductor integrity may occur at any edge of any layer formed on the surface of the substrate or another layer such as a conductor crossing another conductor (and insulator) particularly if the layer is relatively thick or patterned in a manner to form a sharp angle with the surface of the substrate or other underlying layer, as may be required in many electronic elements.

Formation of capacitors in integrated circuits is generally well-known. Trench capacitor structures employed to save space in, for example, large dynamic memories, however, tend to exhibit variation in capacitance because of low carrier concentrations at interfaces of both capacitor plates. Another concern is the limited voltage which may be applied across the dielectric of a trench capacitor structure. While such a variation in capacitance and voltage limitation is generally tolerable in digital circuits, there are many types of analog circuits in which variation in capacitance with voltage is not tolerable and requires metal plates to increase carrier concentrations. The thickness of two metal plates and an intervening capacitor dielectric layer is generally sufficient to present severe topography and thus to compromise the integrity of conductors and other structures which may be formed thereover. Further, due to the difference in thickness of such a so-called metal-to-metal capacitor from the thickness of conductors and the presence of a capacitor dielectric required separate formation of capacitors and interconnect, particularly of the redundant conductor type, during the same processes or at the same level, compounding the complexities imposed by device topography (such as planarization for formation of subsequent overlying layers) and causing increased cost and reduction in manufacturing yield because of the required separate manufacturing processes. Moreover, when overlying structures are to be formed over a group of layers containing both interconnects and metal-to-metal capacitors, the number of layers involved in portions of the structure causes increased difficulty and expense in planarization of a passivation layer or inter-level dielectric structure.

SUMMARY OF THE INVENTION

It is therefore an object of the present invention to provide a metal conductor and metal-to-metal precision capacitor structure which is highly resistant to metal migration and can be formed with the same process.

It is another object of the invention to provide an interconnect structure and manufacturing process which permits simultaneous production of interconnects which are highly resistant to metal migration coplanar with high precision capacitors.

It is a further object of the invention to provide a semiconductor device structure in which a group of layers containing both interconnects and metal-to-metal capacitors allows planarization of an overlying passivation layer or inter-level dielectric to be readily and economically achieved.

In order to accomplish these and other objects of the invention, an electronic device is provided including an interconnect and a capacitor, both including respective portions of a first metal layer, a dielectric layer and a second metal layer, and further including a connection to both the first metal layer and the second metal layer of the interconnect and a connection to each of the first metal layer and the second metal layer of the capacitor.

In accordance with another aspect of the invention, a method of making an electronic device and an electronic device formed by the method is provided including the steps of depositing a first metal layer and a dielectric layer on a surface, patterning the first metal layer and the dielectric layer to form a first aperture, depositing a second metal layer on the dielectric layer, patterning the second metal layer to form a second aperture overlying the first aperture, and connecting the first metal layer and the second metal layer at an edge of the second aperture.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
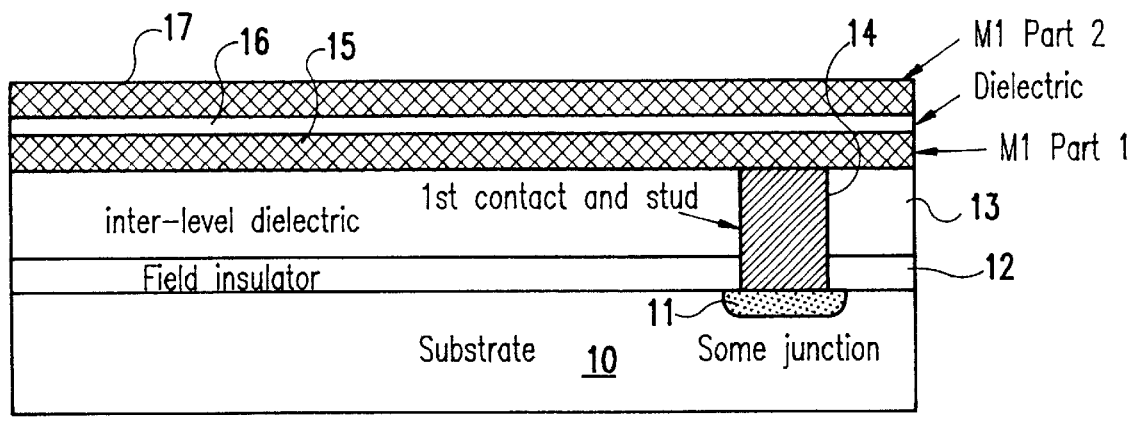
FIGS. 1, 2 and 3 are cross-sectional views of a substrate illustrating formation of an interconnect and a capacitor in accordance with the invention.

Referring now to the drawings, and more particularly to FIG. 1, there is shown, in cross-sectional view, an early stage in the fabrication of a semiconductor circuit structure in accordance with the invention. It should be understood that the illustration of FIGS. 1–6 assume formation of the structure at a so-called first metal level for simplicity and to illustrate a useful form of plug or stud connection thereto but that the structure can also be formed directly on a substrate or an any layer of a multi-layer integrated circuit over a preferably planarized inter-level dielectric and preferably contiguous therewith.

Specifically, as shown in FIG. 1, substrate 10 may have any number or type of integrated circuit structures formed thereon or therein, symbolically indicated by a junction 11 such as an implanted and/or diffused impurity conductive region 11 which may be connected to an overlying layer in a manner which will be described below. Such structures as may be thus formed are then covered with a blanket field insulator 12, followed by an inter-level dielectric layer 13 which preferably can be planarized. Planarization can be accomplished by known techniques such as chemical-mechanical polishing. Layers 12 and 13 could also be formed by a single layer of insulating material.

If a connection is to be made to or from a lower layer (e.g. substrate 10), layers 12 and 13 are then patterned to form a via aperture for a plug or stud 14 of conductive material such as metal which is deposited therein. If such a connection is to be made, planarization can be delayed until after plug deposition or further planarization can be performed to remove metal from the upper surface of layer 13 and to avoid or limit protrusion of the metal plug above the upper-surface of layer 13. Then, a metal or alloy (e.g. CuAlSi), hereinafter simply "metal", layer 15, and insulator 16 and a further metal or alloy layer 17 are applied. Each of the metal layers 15, 17 is preferably about one-half the nominal thickness of an interconnect in accordance with the design rules for a particular design. It is also considered preferable to form both metal layers of the same metal or alloy to obtain a consistent coefficient of thermal expansion.

A thickness of about 150 nm is preferred and adequate to the practice of the invention. Thickness of insulator 16 is noncritical to the practice of the basic principles of the invention but should preferably be designed in view of a desired capacitance value and available capacitor plate area consistent with the electrical and physical integrity of the insulator material. The insulator material is similarly non-critical to the practice-of the basic principles of the invention and silicon oxide, silicon nitride, and oxide-nitride-oxide layered structure or tantalum oxide may generally be used unless the capacitors of a particular circuit design requires a higher dielectric constant insulator, such as barium-strontium-titanate which can also be used in the practice of the invention.

Figure 2:
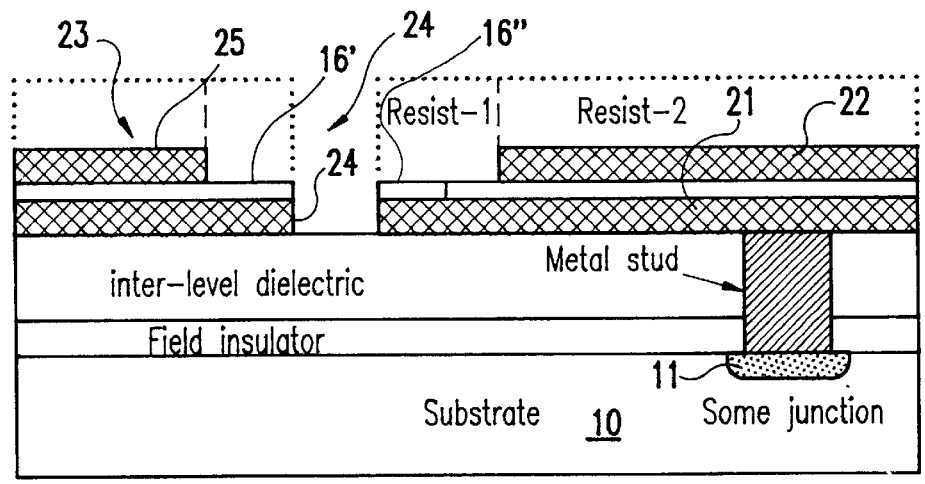

Referring now to FIG. 2, layers 15, 16 and 17 of the structure of FIG. 1 are patterned to form capacitor plates (e.g. 21, 22) and a conductor (e.g. 23) and to form a stepped structure at a portion of each where connections are to be made. This patterning is preferably carried out in a two step process and the order of some steps is arbitrary or can be done as may be required by a particular design. Essentially, portions of the layered structure comprising layers 15, 16 and 17 must be separated by etching down to the inter-level dielectric 13 to form the boundaries of the interconnect and/or capacitor structures and layer 17 must be etched to at least the dielectric layer 16 to form a stepped structure to facilitate connections thereto but in no particular order. At least subsequent to patterning of layer 17, dielectric layer 16 should be additionally patterned as desired interconnects may dictate. However, this can advantageously be done at the same time the inter-level dielectric 31 is patterned for formation of metal studs 32, 33 and 34, as will be described below with reference to FIG. 3. If done separately however, it is generally preferable that the entire portion 16' exposed by opening of layer 17 should be removed for formation of connections to conductors and a lesser area 16" should be removed for connection to capacitors to increase registration tolerances. However, removal of only a portion of the dielectric as shown at 16" is adequate for the practice of the invention but may impose limits or a trade-off between registration tolerances and minimum stud size as will be evident to those skilled in the art in view of this description. The resist, exposure, resist development and etching methodology and process are completely arbitrary for practice of the basic principles of the invention although some processes and materials may be preferred for fabrication of particular designs, as will also be abundantly evident to those skilled in the art.

Once layers 15, 16 and 17 are suitably patterned a blanket inter-level dielectric 31 can be applied over and preferably contiguous with layer 17 and patterned by any technique suitable to the material thereof to form apertures where connections are to be made to metal layers 15 and 17 and via metal studs (e.g. 32, 33 and 34) deposited, as described above. The deposition method for the metal studs is not important to the practice of the invention. The patterning of the inter-level dielectric 31, while not particularly critical as to accuracy or registration, is important to the formation of the structure in accordance with the invention since the connections made to layers 15, 17 determine the functions of those layers.

Figure 3:
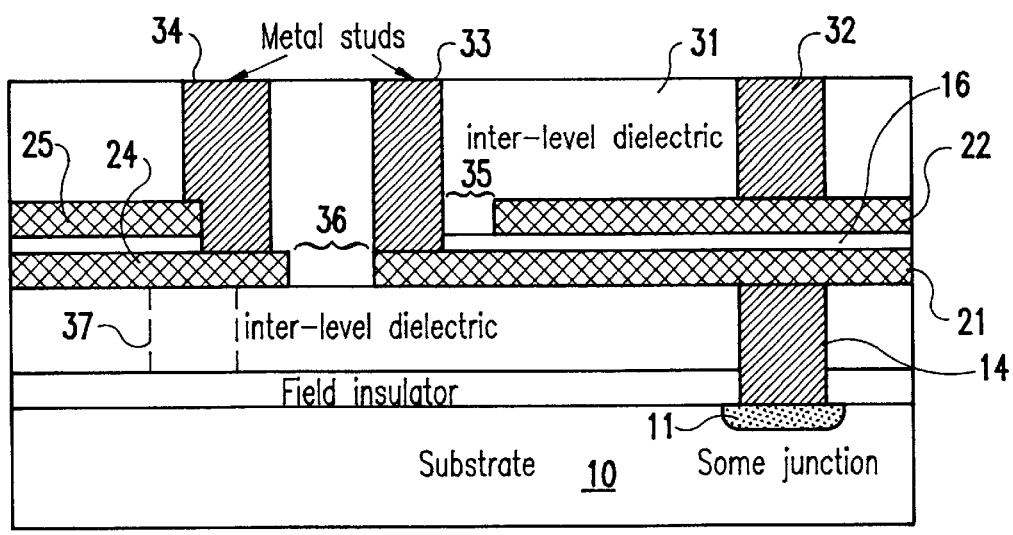

Specifically, metal studs 32, 33 are respectively connected to only one of layers 17, 15 since the structure at the right side of FIGS. 1–3 is intended to be a precision metal-to-metal capacitor. Stud 32 is connected to only the upper plate 22 and can be located at any point above the capacitor, just as stud 14 can be located at any point below the capacitor.

The location of stud 33 is slightly more critical since it must contact only the lower capacitor plate 22 from above. However, the patterning (e.g. at 16") of dielectric layer 16 provides a substantial region 35 upon which the location of stud 33 may encroach while correctly forming the connection. Similarly, the patterning of layer 15 provides a similar registration tolerance in the opposite direction.

It should be noted that a connection may be formed as illustrated between metal stud 14 and metal stud 33 through the capacitor plate 21 although either of studs 14 and 33 could be omitted as the design may require. If both connections are made, current density in the capacitor plate is generally not sufficiently great to cause metal migration since such a capacitor plate is generally at least several times the width of a conductor. However, since the connection is made only through metal layer 21, the relative location and proximity of studs 14 and 33 and current density limitation may be important design considerations.

Metal stud 34 which corresponds to an interconnect termination (although one or more similar studs may be formed at intermediate locations along the length of the interconnect, as desired) contacts both layers 24 and 25 of the interconnect. In this case, registration tolerance is provided by the transverse dimension of metal stud 34 which can advantageously be enlarged somewhat relative to studs 32 and 33 and can be made comparable to registration tolerances 35 and 36. In this regard it should be noted that studs 32 and 33 are generally required to carry only currents sufficient to charge and discharge the precision metal-to-metal capacitor; which currents are generally small and of low duty cycle. Therefore, current carrying requirements of metal studs 32 and 33 are low and studs 32 and 33 can be made relatively small. Accordingly, it is preferable to size the transverse dimension of stud 34 in accordance with registration tolerance 36 and to form stud 33 as small as current carrying requirements permit in order to maximize registration tolerance 35. In any event, meeting registration tolerances can be readily achieved.

Thus, it is seen that the structure formed in accordance with the invention allows formation of a precision metal-to-metal capacitor in the same layer with an interconnect. Connection to the capacitor or conductor (e.g. as shown by dashed lines 37) can be made either from the same layer or layers above or below the capacitor and/or interconnect. The conductor which, in contrast to known redundant conductor structures has an insulator structure between the metal layers, is expected to be highly resistant to failure from electromigration and/or stress migration (particularly for aluminum) at least for the reason that thinning of one metal layer does not cause localized increase of current density in the other metal layer. Severe topography is avoided and the structure is readily and easily planarized to allow accurate lithography to form further layers having interconnects, capacitors and other electronic components therein. Additionally, process complexity and problems of corrosion and adhesion between layers associated with the use of diverse metals and alloys are avoided.

Figure 4:
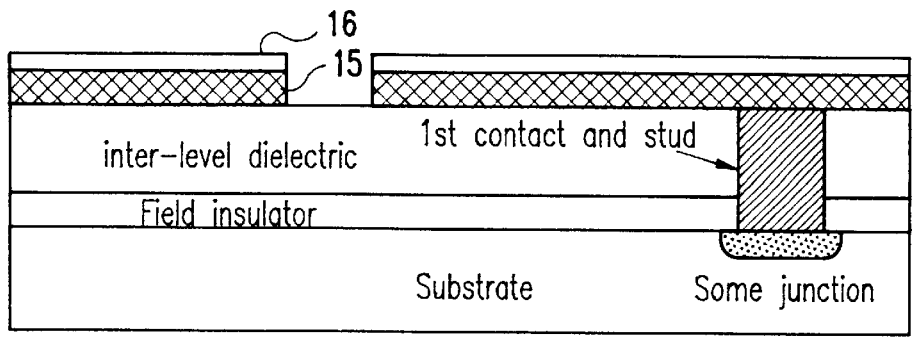
FIGS. 4, 5 and 6 are cross-sectional views of a substrate illustrating formation of an interconnect and a capacitor in accordance with a variation of the invention.
Figure 5:
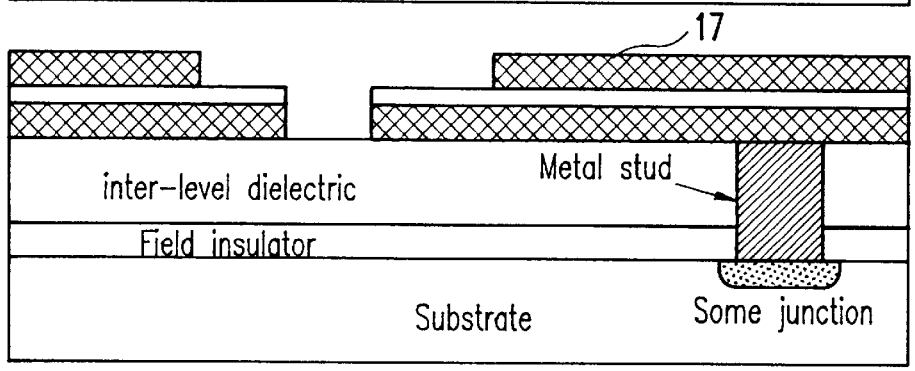
Figure 6:
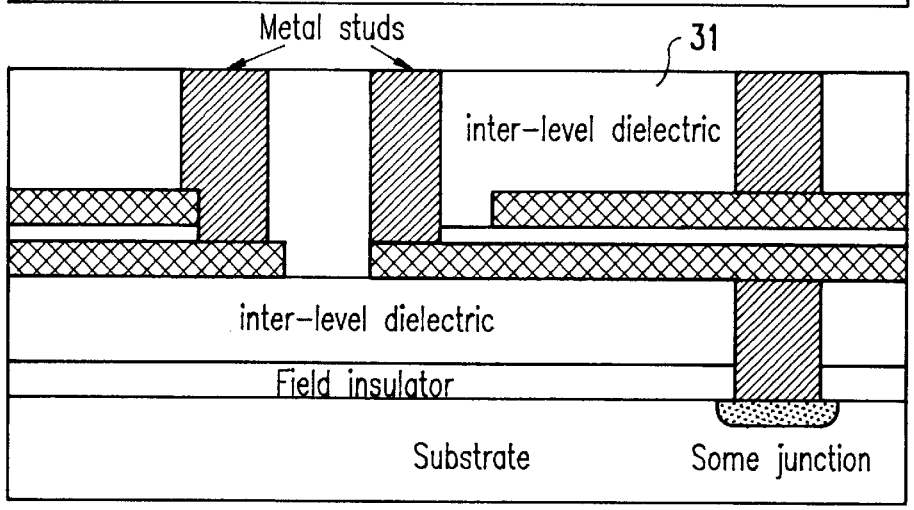

Referring now to FIGS. 4–6, an alternative method for fabricating the structure in accordance with the invention will be described. Principally, this alternative method differs from that described above by patterning the metal and insulator layers 15 and 16 prior to formation of a following metal layer 17, as shown in FIG. 4. Since this alternative process maintains a more nearly planar surface, lithographic exposure may be somewhat more accurately performed. This process may also be advantageously combined with other processes for forming other structures, depending on the chip design, since the metal deposition and patterning steps are separated. The dielectric layer 16 can serve to protect the surface of metal layer 15 from oxidation, corrosion and some additional processes which might be employed prior to deposition of metal layer 17.

Subsequently, a second blanket metal layer 17 is deposited and patterned as shown in FIG. 5. It should be noted that the patterning of layer 17 will also remove metal in the blanket layer which is deposited in the opening previously formed in layer 15. For this reason, it is preferable that the patterning be performed by an etching process which is highly selective between metal and dielectric layer 16 which can then serve as a mask for layer 15 to prevent further etching thereof during the process of patterning layer 17. The particular patterning process used is otherwise unimportant to the invention. The dielectric layer 16 can be further patterned either before or, preferably, after deposition of metal layer 17 but, as before, is advantageously patterned in accordance with patterning of the inter-level dielectric 31 for deposition of metal studs, as shown in FIG. 6, to complete the structure.

Figure 7:
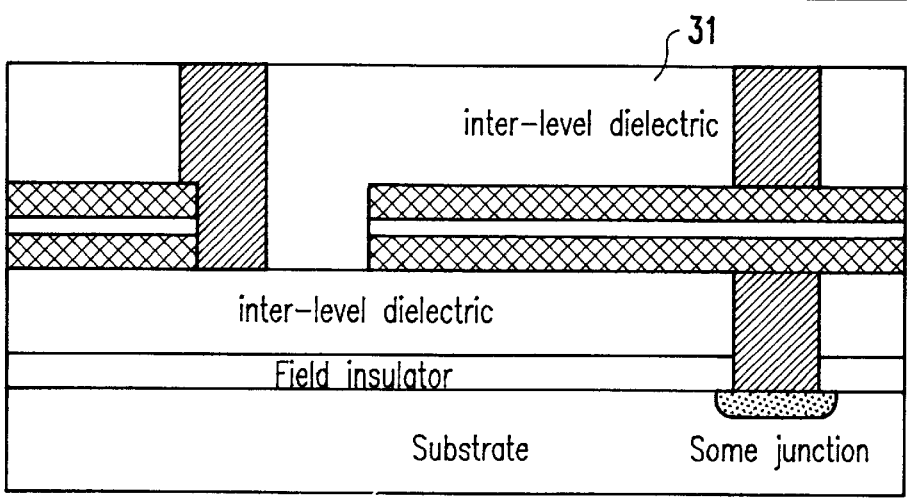
FIG. 7 shows, in cross-section, an alternative structure which can be formed in accordance with either of the above variations of the invention.

In either of the variations discussed above in connection with FIGS. 1–3 or 4–6, while preferred, the stepped structure at connection locations at interconnect terminations is not entirely necessary to the practice of the principles of the invention. As shown in FIG. 7, a connection to both layers 15 and 17 can be made in a single material removal step. Particularly for aluminum, a substantially perpendicular end surface of the layered interconnect would then be formed. (Other combinations of metals and etch processes may form a sloping end face having some of the properties of both the embodiment of FIGS. 1–6 and FIG. 7.) A metal stud can then be formed in an opening in inter-level dielectric 31 covering the end face of the interconnect and connected to both metal layers 15 and 17. Connections to the capacitor may be made with studs within the boundaries of the metal plates from respective sides of the layer.

This embodiment of the invention is less preferred for most applications at the present time since the reduced contact area to the metal layers of the interconnect increases contact resistance. Potential contact area to the capacitor plates is unaffected but the embodiment is somewhat restricted in that connections to the capacitor plates cannot be made from the same side of the layer without additional structure which may negate space savings and reduction of process steps. However, chip space is saved for interconnects in comparison with a stepped structure and for capacitors in which the connections can be properly routed. Thus the embodiment of FIG. 7 would be appropriate where integration density is of paramount importance. Further, as noted above, a patterning step would be saved relative to the variations of the invention illustrated in FIGS. 1–6 and the variation of FIG. 7 may be relatively favored for that reason.

In view of the foregoing, it is seen that the invention provides a metal migration resistant interconnect in the same layer with a precision metal-to-metal capacitor. The interconnect and capacitor can be simultaneously formed in the same process with substantial increase in process economy and manufacturing yield. Further, the structure can be formed at any desired level or any desired number of levels within an integrated circuit and planarization of an inter-level dielectric can be readily performed. Further, while the invention is expected to be most advantageously employed in integrated circuits, electronic devices of larger scale such as flexible chip carriers may advantageously employ the invention to concurrently form interconnects and capacitors in the same structural level even where metal migration is not observed. Conversely, the invention provides an interconnect structure highly resistant to failure due to metal migration, even when aluminum and aluminum alloys are used which avoids problems of adhesion and corrosion incident to the use of dissimilar metals in a layered structure.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An electronic device including an interconnect and a capacitor, said interconnect and said capacitor including respective portions of a first metal layer, a dielectric layer and a second metal layer, said dielectric layer being interposed between said first metal layer and said second metal layer, said electronic device further including a common connection to both said first metal layer and said second metal layer of said interconnect and a separate connection to each of said first metal layer and said second metal layer of said capacitor whereby said interconnect and said capacitor are resistant to metal migration and can be formed by respective portions of said first metal layer and said second metal layer with the same process steps.

2. An electronic device as recited in claim 1, further including an inter-level dielectric layer contiguous with one of said first metal layer and said second metal layer, and a stud formed in apertures in said inter-level dielectric layer.

3. An electronic device as recited in claim 1, wherein said dielectric layer interposed between said first metal layer and said second metal layer is one of an oxide, a nitride, and a layered structure comprising an oxide and a nitride.

4. An electronic device as recited in claim 3, wherein said dielectric layer interposed between said first metal layer and said second metal layer includes one of silicon oxide and silicon nitride.

5. An electronic device as recited in claim 1, wherein said dielectric layer interposed between said first metal layer and said second metal layer is tantalum oxide.

6. An electronic device as recited in claim 1, wherein said dielectric layer interposed between said first metal layer and said second metal layer is barium strontium titanate.

7. An electronic device formed by a process including the steps of depositing a first metal layer and a dielectric layer on a surface, patterning said first metal layer and said dielectric layer to form a first aperture, depositing a second metal layer on said dielectric layer, patterning said second metal layer to form a second aperture overlying said first aperture, and forming at least one of a connection between a portion of said first metal layer and a portion of said second metal layer and a selective connection to only one of said first metal layer and said second metal layer within said second aperture at only an edge of said second aperture and a second connection to the other of said first metal layer and said second metal layer whereby at least one of an interconnect and a capacitor which are resistant to metal migration can be formed by respective portions of said first metal layer and said second metal layer with the same process steps.

8. An electronic device as recited in claim 7, wherein said step of connecting said first metal layer and said second metal layer comprises the further steps of forming a patterned inter-level dielectric layer over said second metal layer, and depositing conductive material in an aperture of said patterned inter-level dielectric layer.

9. An electronic device formed by a process as recited in claim 8, including the further step of:

patterning said dielectric layer in accordance with apertures in said patterned inter-level dielectric layer.

10. An electronic device formed by a process as recited in claim 8, including the further step of planarizing said inter-level dielectric layer.

11. An electronic device formed by a process as recited in claim 7, wherein said step of patterning said first metal layer and said dielectric layer to form a first aperture is performed prior to said step of depositing a second metal layer on said dielectric layer.

* * * * *